(12) United States Patent
Krampert et al.

(10) Patent No.: US 9,212,949 B2
(45) Date of Patent: Dec. 15, 2015

(54) TECHNIQUE FOR TEMPERATURE MEASUREMENT AND CALIBRATION OF SEMICONDUCTOR WORKPIECES USING INFRARED

(71) Applicant: Varian Semiconductor Equipment Associates, Inc., Gloucester, MA (US)

(72) Inventors: Jeffrey E. Krampert, Topsfield, MA (US); Roger B. Fish, Bedford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 99 days.

(21) Appl. No.: 14/228,802

(22) Filed: Mar. 28, 2014

(65) Prior Publication Data
US 2015/0276487 A1     Oct. 1, 2015

(51) Int. Cl.
  *G01J 5/02*   (2006.01)
  *G01K 15/00*  (2006.01)
  *G01J 5/00*   (2006.01)

(52) U.S. Cl.
  CPC ............... *G01J 5/02* (2013.01); *G01K 15/005* (2013.01); *G01J 2005/0051* (2013.01); *H01J 2237/2065* (2013.01); *H01J 2237/31701* (2013.01)

(58) Field of Classification Search
  CPC ... G01K 15/005; G01J 5/02; G01J 2005/0051
  See application file for complete search history.

(56) References Cited

U.S. PATENT DOCUMENTS

| | | | | |
|---|---|---|---|---|
| 3,504,524 | A * | 4/1970 | Maley | G01N 21/91 374/124 |
| 5,052,661 | A * | 10/1991 | Dunlay | C21D 11/00 148/511 |
| 6,299,346 | B1 * | 10/2001 | Ish-Shalom | G01J 5/0003 374/126 |
| 7,318,672 | B2 * | 1/2008 | Hardcastle, III | G01N 17/002 356/51 |
| 2003/0236642 | A1 * | 12/2003 | Timans | G01J 5/0003 702/99 |
| 2006/0190211 | A1 | 8/2006 | Schietinger et al. | |
| 2007/0076780 | A1 * | 4/2007 | Champetier | G01J 5/0003 374/121 |
| 2009/0316749 | A1 | 12/2009 | Davis | |
| 2009/0323759 | A1 | 12/2009 | Govindaraju et al. | |

FOREIGN PATENT DOCUMENTS

JP   2002-301660 A    10/2002
KR   10-2010-0039455 A    4/2010

OTHER PUBLICATIONS

International Search Report/Written Opinion mailed May 29, 2015 in corresponding PCT application No. PCT/US2015/019893.

* cited by examiner

*Primary Examiner* — Marcus Taningco
*Assistant Examiner* — Mindy Vu (57) ABSTRACT

An improved system and method of measuring the temperature of a workpiece in a processing chamber is disclosed. Because silicon has very low emissivity in the infrared band, a coating is disposed on at least a portion of the workpiece. This coating may be graphite or any other material that can be readily applied, and has a relatively constant emissivity over temperature in the infrared spectrum. In one embodiment, a coating of graphite is applied to a portion of the workpiece, allowing the temperature of the workpiece to be measured by observing the temperature of the coating. This technique can be used to calibrate a processing chamber, validate operating conditions within the processing chamber, or to develop a manufacturing process.

20 Claims, 9 Drawing Sheets

TECHNIQUE FOR TEMPERATURE MEASUREMENT AND CALIBRATION OF SEMICONDUCTOR WORKPIECES USING INFRARED

FIELD

This disclosure relates to temperature measurement of workpieces, more particularly, to temperature measurements of silicon workpieces using infrared sensors.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Recently, higher temperature implants, such as above 100° C., have shown promise. For example, FinFET amorphization implants have shown the potential for single crystal regrowth when performed at temperatures exceeding 100° C. These recited temperatures are those of the workpiece itself. Techniques for workpiece temperature measurement are limited by the requirements of the processing environment. For example, thermocouples attached to the workpiece are impractical. Alternatively, thermocouples mounted to the platen are of limited use, as the temperature of the platen may differ from that of the workpiece due to problems associated with establishing good thermal contact between the platen and the workpiece. Additionally, the optical properties of silicon make the application of common infrared techniques difficult or impossible.

Thus, any method that allows for calibration and measurement of the temperature of a workpiece in a processing chamber would be beneficial.

SUMMARY

An improved system and method of measuring the temperature of a workpiece in a processing chamber is disclosed. Because silicon has very low emissivity in the infrared band, a coating is disposed on at least a portion of the workpiece. This coating may be carbon based or any other material that can be readily applied, and has a relatively constant emissivity over the temperature range of interest in the infrared spectrum. In one embodiment, a coating of carbon is applied to a portion of the workpiece, allowing the temperature of the workpiece to be measured by observing the temperature of the coating. This technique can be used to calibrate a processing chamber, validate operating conditions within the processing chamber, or to develop a manufacturing process.

According to one embodiment, a processing system is disclosed. The processing system comprises a platen; a calibration workpiece disposed on the platen; an IR camera using a range of wavelengths in an infrared spectrum to determine a temperature of the calibration workpiece; and a coating disposed on a portion of an upper surface of the calibration workpiece, the coating having a nearly constant emissivity over a range of temperatures at the range of wavelengths.

According to a second embodiment, a method of calibrating a workpiece process is disclosed. The method comprises maintaining a heated platen in a process chamber at an elevated temperature greater than 100° C.; introducing a calibration workpiece to the process chamber, the calibration workpiece comprises a coating on a portion of its upper surface, the coating having a nearly constant emissivity over a desired temperature range; placing the calibration workpiece on the heated platen; monitoring a temperature of the calibration workpiece over time by focusing an IR camera at the portion; and recording a time for the calibration workpiece to reach a predetermined temperature. In a further embodiment, the method further comprises processing a workpiece after the recording, wherein the processing comprises: placing the workpiece on the heated platen; waiting a predetermined amount of time; and processing the workpiece after the waiting, where the predetermined amount of time is determined based on the recorded time for the calibration workpiece to reach the predetermined temperature.

According to another embodiment, a method of validating a workpiece manufacturing process is disclosed. The method comprises introducing a first workpiece into a process chamber; disposing the first workpiece on a heated platen in the process chamber, the heated platen at an elevated temperature greater than 100° C.; processing the first workpiece while on the heated platen; introducing a calibration workpiece into the process chamber in a same manner as the first workpiece was introduced, wherein the calibration workpiece comprises a coating on a portion of its upper surface, the coating having a nearly constant emissivity over a desired temperature range; measuring a temperature of the calibration workpiece using an IR camera focused at the portion having the coating; and verifying the temperature is within an acceptable range. In a further embodiment, the method further comprises introducing a second workpiece into the process chamber after verifying the temperature is within the acceptable range; disposing the second workpiece on the heated platen in the process chamber; and processing the second workpiece while on the heated platen. In another further embodiment, the method further comprises performing a corrective action if the temperature is not within the acceptable range.

According to another embodiment, a method of processing a workpiece at an elevated temperature is disclosed. The method comprises applying a coating to a first portion of an upper surface of the workpiece, the coating having a nearly constant emissivity about a desired temperature range; placing the workpiece on a heated platen; focusing an IR camera at the first portion so as to monitor a temperature of the workpiece; processing a second portion of the workpiece, the second portion different from the first portion; and adjusting a temperature of the heated platen based on the monitored temperature of the workpiece while the workpiece is being processed so as to maintain the workpiece at the elevated temperature, wherein the elevated temperature is greater than 100° C.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
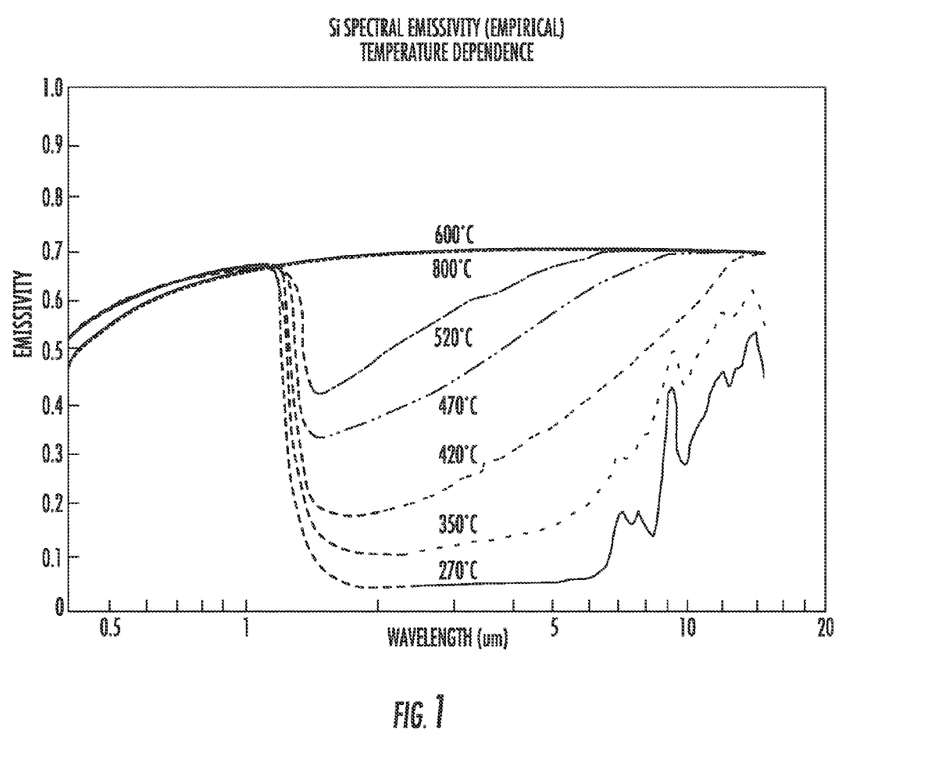
FIG. 1 is a graph showing the spectral emissivity of silicon.

As described above, the optical properties of silicon make the use of infrared techniques to measure temperature difficult or impossible. FIG. 1 shows the spectral emissivity of silicon at a plurality of temperatures and wavelengths. The wavelengths represented in this graph are those associated with the infrared spectrum used by traditional infrared cameras. Emissivity is a measure of a material's ability to emit energy via radiation. As seen in FIG. 1, at low temperatures, silicon loses its ability to emit any radiation in the infrared spectrum, having an emissivity of near zero. As the temperature of the silicon increases, the emissivity of the silicon also increases. At 800° C., the emissivity of silicon is nearly constant at close to 0.7. This optical behavior is problematic for several reasons.

First, at a particular wavelength in the infrared spectrum, the emissivity of silicon changes as a function of its temperature. Therefore, using an infrared camera that operates at a single wavelength or a narrow range of wavelengths, it is impossible to relate the emitted radiation to an actual temperature. Infrared cameras measure emitted radiation at a particular wavelength or narrow range of wavelengths, and based on the amount of emitted radiation and the emissivity of the material, determine the material's temperature. A non-constant emissivity at that particular wavelength makes it impossible for an infrared camera to determine the material's temperature using only one wavelength. Thus, traditional IR cameras are unable to accurately determine the temperature of silicon at lower temperatures.

Figure 2:
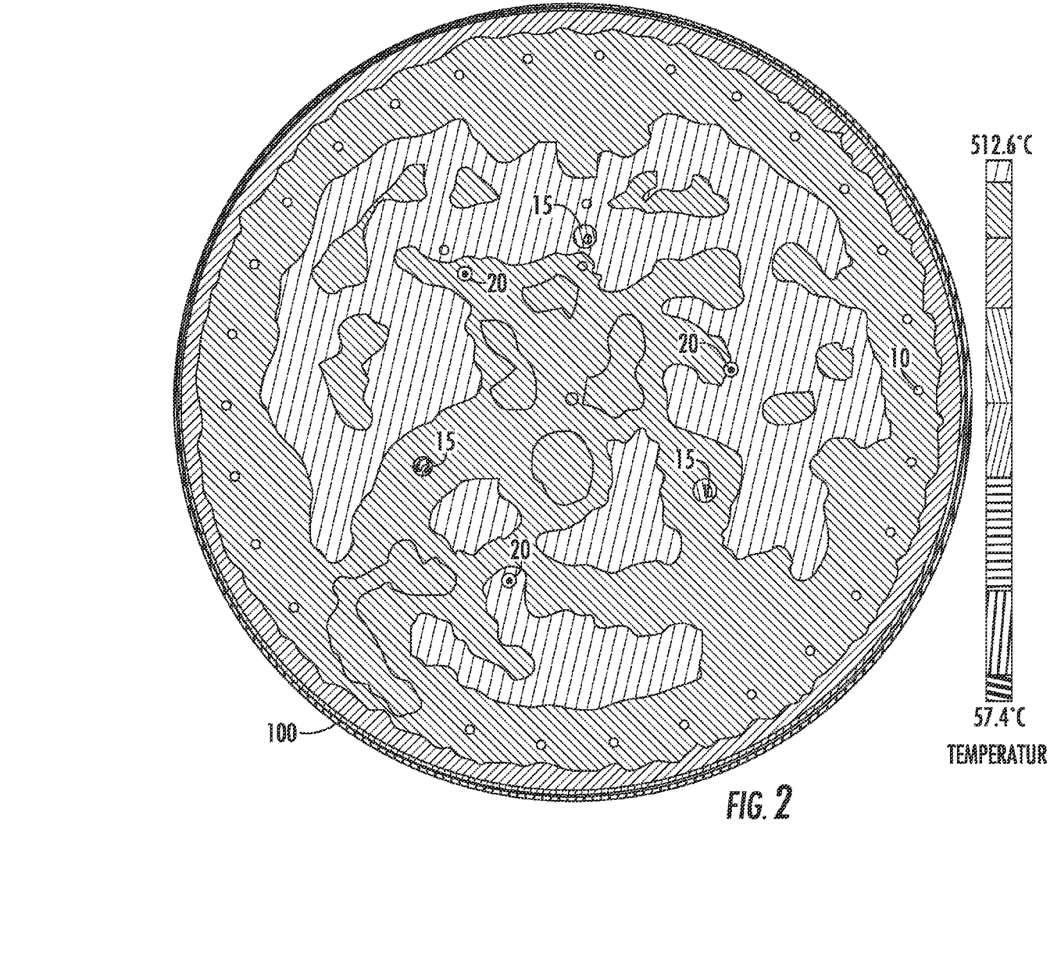
FIG. 2 is a thermal image of a heated platen.

Second, the near zero emissivity of silicon at low temperatures means that any infrared measurements that are recorded are actually associated with the material disposed beneath the silicon. FIG. 2 shows a thermal image of an exposed platen 100, which is at a temperature of nearly 500° C. The platen 100 may be heated by the introduction of hot liquids into passages disposed within the platen 100. Alternatively, the platen 100 may be heated through the use of electrical heating elements disposed in the platen 100. The ring of dots 10 around the circumference of the platen 100 may represent passageways through which back side gas is fed toward the back side of the workpiece. This backside gas improves the conduction of heat from the platen 100 to a workpiece disposed thereon. The three regions 15 closer to the center of the platen 100 may represent the lift pins used to lift the workpiece from the platen 100 after processing. Dot shaped regions 20 may represent ground pins, used to remove charge from the workpiece.

Figure 3:
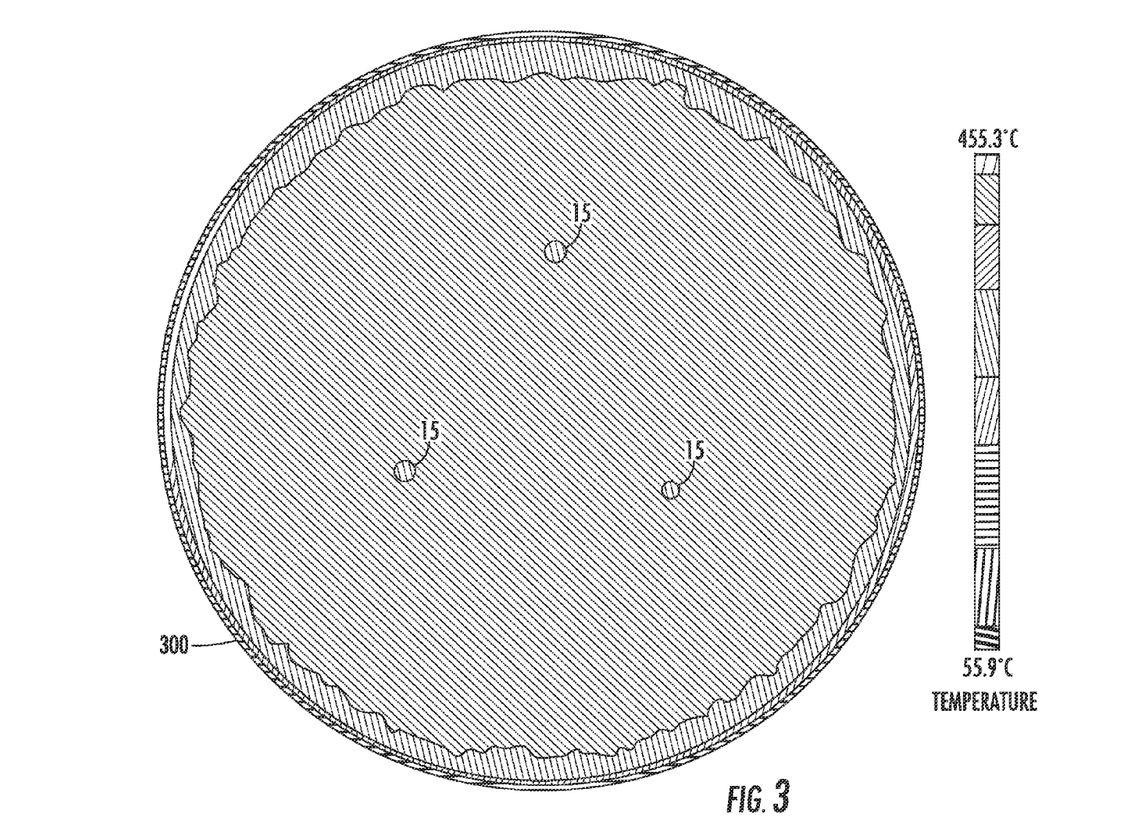
FIG. 3 is a thermal image of a silicon workpiece held above a heated platen by lift pins.
Figure 4:
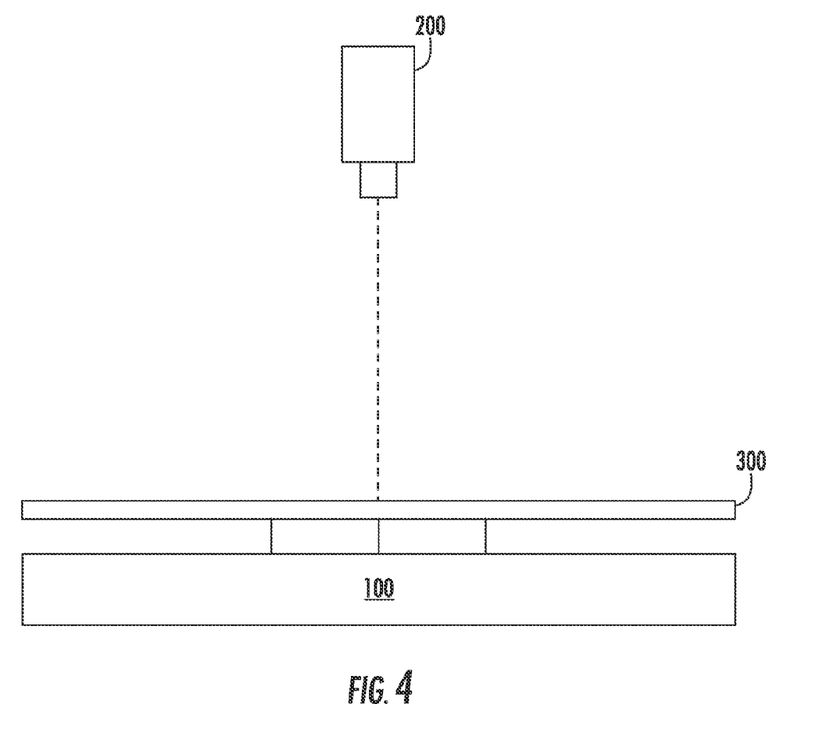
FIG. 4 shows a representative configuration of an IR camera, a workpiece and a platen.

FIG. 3 shows the same platen, now covered by a silicon workpiece 300. The silicon workpiece 300 is being held above the heated platen by the 3 lift pins. As this is a top view, the platen is under the workpiece, such that the workpiece 300 is disposed between the IR camera and the platen. A representation of this configuration is shown in FIG. 4. FIG. 4 shows the IR camera 200 disposed above the platen 100. The silicon workpiece 300 is disposed on the lift pins, thereby separating the silicon workpiece 300 from the platen 100. The thermal image in FIG. 3 suggests that the silicon workpiece 300 is at a temperature of between 400° C. and 500° C. However, the actual temperature of the silicon workpiece is actually much closer to 50° C., although this cannot be determined based on the thermal image. This is because the thermal image is actually recording and measuring the temperature of the platen 100, albeit somewhat attenuated by the silicon workpiece 300 disposed in front of it.

Figure 5:
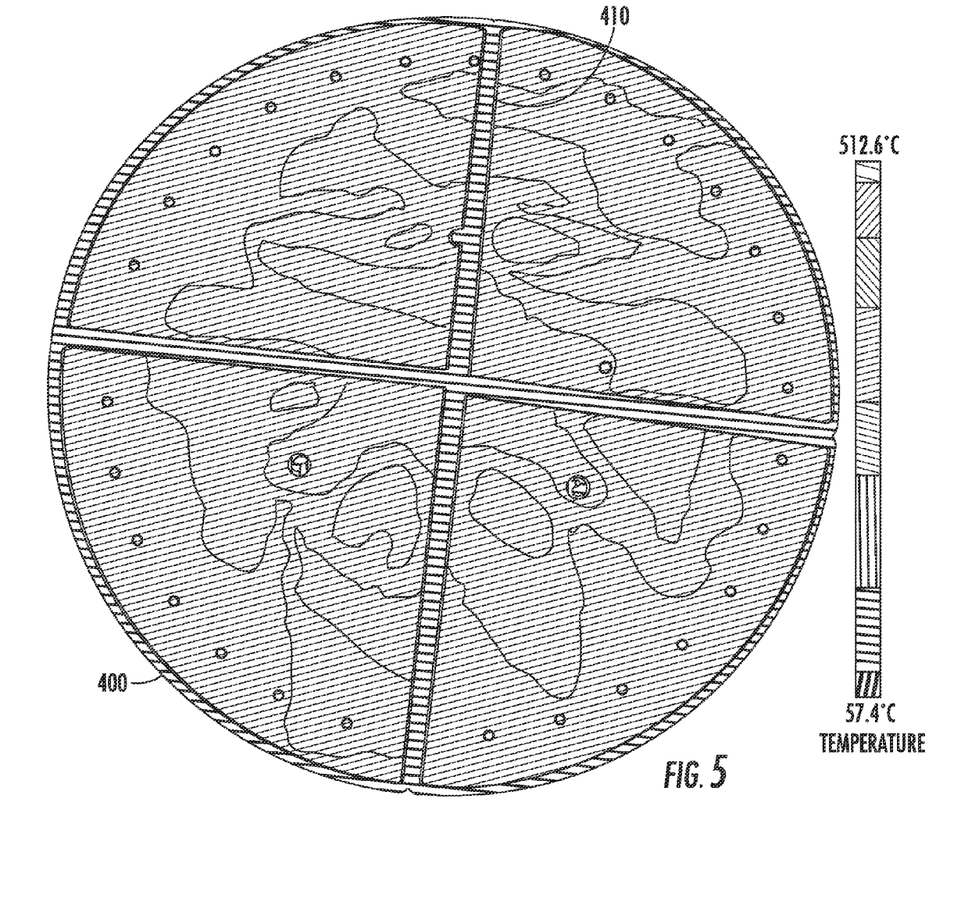
FIG. 5 shows an unheated calibration workpiece disposed on a heated platen.

FIG. 5 shows a thermal image of a calibration workpiece 400 disposed on a heated platen, where a portion 410 clearly appears to be at a different temperature than the rest of the calibration workpiece 400. This portion 410 may have a pattern in the shape of two orthogonal diameters. In other embodiments, this portion 410 may be a single diameter. This portion 410 had been previously coated with a coating that has a nearly constant emissivity in the infrared spectrum. In this disclosure, the term "nearly constant emissivity" denotes that the emissivity of the material changes less than 20% over a desired temperature range. In other embodiments, the substance may have emissivity changes of less than 10% over the desired temperature range. Furthermore, in situations where the target final temperature is known, the term "nearly constant emissivity" may denote that the emissivity of the substance over a narrow temperature range, such as within 50° C. of the target final temperature, is less than 10%, or in some embodiments 5%. The IR camera typically uses a fixed emissivity value, which is a good approximation at temperatures close to the target final temperature. In some embodiments, the fixed emissivity used by the IR camera is equal to the emissivity at the target final temperature. Thus, the IR camera readings will be accurate at temperatures near the target final temperature. In this way, the temperature measurement for those portions 410 is known to be accurate, while the rest of the calibration workpiece 400 may be indeterminate. In other words, the thermal image of FIG. 3, which suggests that the workpiece is at a temperature of between about 400° C. and 500° C. is inaccurate. Rather, only the coated portion 410 represents the actual temperature of the workpiece 400.

Figure 6:
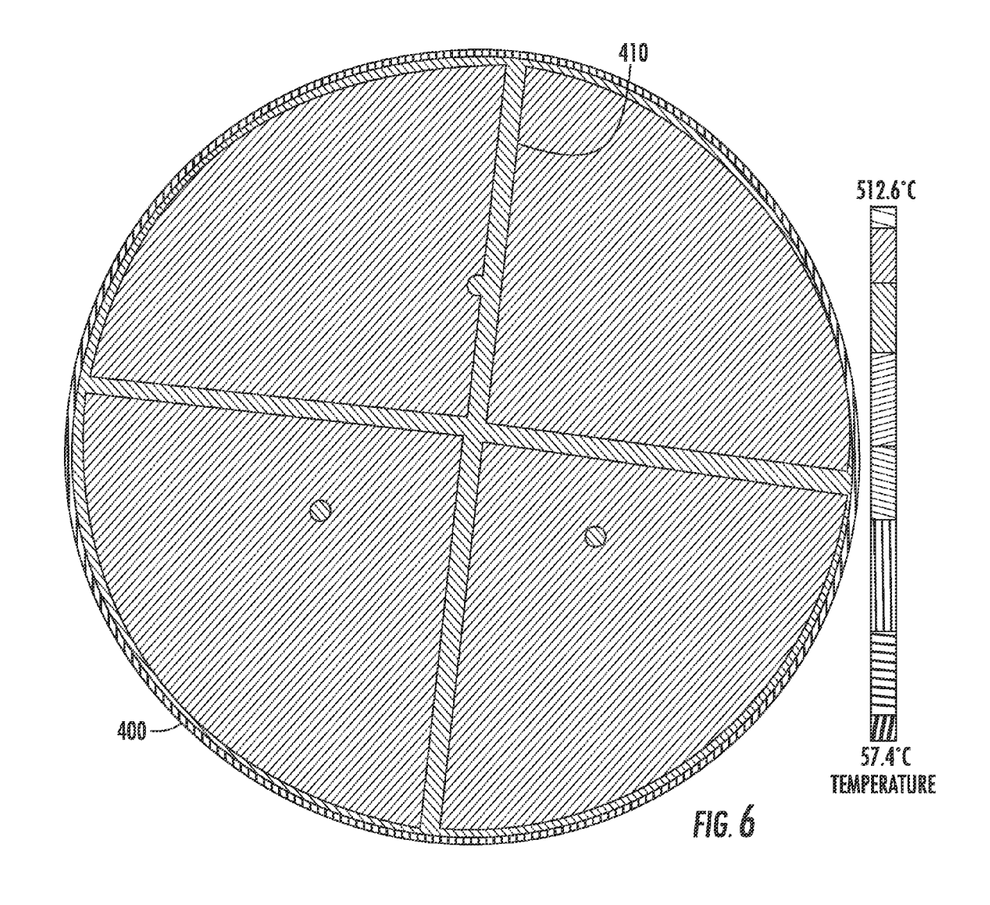
FIG. 6 shows the calibration workpiece of FIG. 5 after it reaches the desired temperature.

FIG. 6 shows the same calibration workpiece 400 after it has been disposed on the hot platen for an extended period of time. Note that the portion 410 now reflects a temperature that is very close to that of the heated platen. This reflects the actual temperature of the workpiece 400. Note that the remainder of the calibration workpiece 400 still appears to be at a slightly higher temperature than it actually is.

In FIGS. 5 and 6, the calibration workpiece 400 has been coated with a substance with nearly constant emissivity over temperature at the desired wavelength. In some embodiments, the desired wavelength is between 1.0 μm and 3.0 μm. In other embodiments, the desired wavelength may be between 3.0 μm and 5.0 μm. In other embodiments, the desired wavelength may be between 7.5 μm and 14 μm. In yet other embodiments, the desired wavelength can be between 1.0 μm and 14 μm. In these figures, the coating has been applied to two orthogonal diameters 410, however the coating can be applied in any desired pattern.

For example, a colloidal suspension of graphite and water can be brushed onto the upper surface of the workpiece. In this embodiment, the colloidal suspension may be brushed onto the upper surface of the workpiece in any desired pattern. The workpiece, now referred to as a calibration workpiece, can be used in any of the procedures described herein.

However, there are numerous other materials that may be used to coat the workpiece, one such coating is a high temperature black coating. Other materials are also possible and the disclosure is not limited to a particular material. Rather, the inclusion of the high temperature black coating was to demonstrate the availability of various materials that would be applicable. Crystalline boron also has a nearly constant emissivity in the temperature range from 300° C. to 650° C. and may be applied as a plasma spray. As stated above, any material that has a nearly constant emissivity over a wide range of temperature at the wavelength used by the IR camera may be employed. In some embodiments, this temperature range may be 0° C. to 600° C. In other embodiments, the temperature range may be 300° C. to 600° C. In yet other embodiments, the temperature range may be 400° C. to 600° C. Those materials that can be sprayed, brushed or otherwise easily applied to the surface of the workpiece may be beneficial. The coating allows the temperature of the silicon workpiece to be accurately measured using traditional IR cameras.

In some embodiments, the coating is only applied to a portion of the upper surface of the workpiece 400. For example, FIGS. 5 and 6 show the portion 410 where the material has been applied is in the shape of two orthogonal diameters. However, in other embodiments, the entire upper surface of the calibration workpiece 400 may be coated to allow the thermal behavior of the entire calibration workpiece 400 to be monitored. In other embodiments, the portion may comprise only a single diameter that is coated on the workpiece. The coating may be applied in any pattern.

For example, by coating the entire upper surface, the temperature uniformity of the entire workpiece can be precisely determined using thermal images. Points that are at a different temperature, such as those directly above the lift pins, can be readily identified. In another embodiment, the use of one or more diameters, as shown in FIGS. 5 and 6, allows uniformity to be estimated as a function of distance from the center of the workpiece. In other words, it may be assumed that the temperature of the workpiece is in some way related to the distance from the center of the workpiece, where the center of the workpiece is likely to be at the highest temperature. Thus, the use of one diameter may allow the temperature of any point on the workpiece to be estimate based on its distance from the center of the workpiece. The use of more than one diameter may allow more complex extrapolation of the temperature profile of the workpiece.

In other embodiments, the temperature uniformity of the workpiece may not be desired or useful. For example, it may be sufficient to simply sample the temperature of the workpiece at a single point. In this embodiment, the coating may be applied to the entirety of the upper surface or to just a portion of the upper surface. The IR camera may then focus specifically on an area of the workpiece where the coating has been previously applied. This allows a simple, quick determination of workpiece temperature. Any of these techniques may be used with the procedures described herein.

The use of a coating has several advantages over other techniques. For example, once the upper surface has been coated, the calibration workpiece 400 can be introduced into the manufacturing process in the same manner as any other workpiece. In other words, there are no special steps required to employ the specially coated calibration workpiece 400. This allows a variety of calibration procedures to be developed.

Figure 7:
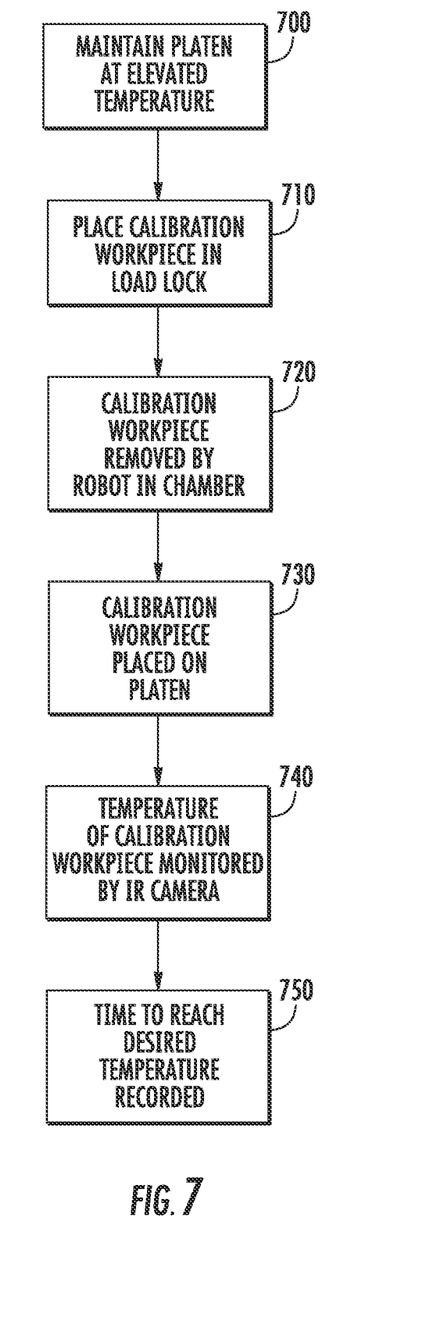
FIG. 7 shows a representative flowchart used to monitor the temperature change of a workpiece.

For example, in a first embodiment, a process is desired that implants a workpiece when that workpiece has reached a predetermined temperature. A calibration workpiece, as described above, may be used to develop the desired process, as shown in FIG. 7. To achieve this, the platen, which is located within the processing chamber, may be maintained at an elevated temperature, such as above 100° C., as shown in operation 700. The calibration workpiece may be introduced into the processing chamber in the same manner as other workpieces. For example, in some embodiments, the calibration workpiece is placed in a load lock, as shown in operation 710. The calibration workpiece is then removed from the load lock by a robotic mechanism, located within the processing chamber, as shown in operation 720. The robotic mechanism can then place the calibration workpiece on the platen, as it would any other workpiece, as shown in operation 730. The calibration workpiece has a coating that has a nearly constant emissivity over a desired temperature range. In this embodiment, the desired temperature range may be a 100° C. range centered around the elevated temperature of the platen. For example, at an elevated temperature of 300° C., the desired temperature range would be 250° C. to 350° C. Using traditional IR cameras, the temperature of the calibration workpiece 400 may be accurately measured and monitored, as shown in operation 740. Therefore, the wait time for the workpiece to reach the desired temperature can be accurately measured and recorded, as shown in operation 750. This time can then be used to create a process that implants workpieces at the desired elevated temperature. To improve the statistical validity of the measured time, a plurality of calibration workpieces may be used to calibrate the process. The plurality of calibration workpieces may all be introduced into the processing chamber in the manner described above and shown in FIG. 7.

Once this wait time has been determined, workpiece can then be introduced into the process chamber through the load lock and placed on the heated platen. After waiting the wait time, the workpiece can then be processed. The wait time may be determined in operation 750 of FIG. 7.

In a further embodiment, the temperature uniformity of the calibration workpiece can be obtained as well. For example, in one embodiment, the coating is applied to the entirety of the upper surface of the calibration workpiece. The IR camera 200 is then focused at a plurality of points on the upper surface to create a thermal image. In another embodiment, the coating is applied to at least one diameter of the upper surface of the calibration workpiece. The IR camera 200 is then focused at a plurality of points on the diameter. Based on this, the temperature uniformity of the calibration workpiece can be estimated. This estimate may relate temperature to distance from the center of the calibration workpiece. The use of more than one diameter may allow more complex estimations to be performed.

In a second embodiment, a process is desired that implants a workpiece when that workpiece has reached a predetermined temperature. Unlike the first embodiment, in this embodiment, the platen is heated only after the workpiece is placed thereon. As before, the calibration workpiece has at least a portion of its upper surface coated with a substance having a near-constant emissivity at the frequency used by the IR camera. The calibration workpiece may be introduced into the processing chamber in the same manner as other workpieces, and as shown in operations 710-730 of FIG. 7. For example, in some embodiments, the calibration workpiece is placed in a load lock. The calibration workpiece is then removed from the load lock by a robotic mechanism, located within the processing chamber. The robotic mechanism can then place the calibration workpiece on the platen, as it would any other workpiece. The platen is then heated and, using traditional IR cameras, the temperature of the calibration workpiece may be accurately measured and monitored. Therefore, the time for the workpiece and platen to reach the desired temperature can be accurately measured. This time can then be used to create a process that implants workpieces at the desired elevated temperature. In a further embodiment, as described above, the temperature uniformity of the workpiece can be measured or estimated using the technique described above.

In a third embodiment, thermocouples or other temperature sensors are disposed on the platen 100. The IR camera 200 is used to monitor the temperature of the calibration workpiece 400. The calibration workpiece 400 may enter the processing chamber as shown in operations 710-730 of FIG. 7. Thereafter, a correlation between platen temperature and workpiece temperature can be created.

While the calibration workpiece may be useful in the developing manufacturing processes as described above, there are other applications for the calibration workpiece. For example, in one embodiment, the calibration workpiece may be introduced into the processing chamber during normal operation.

The introduction of the calibration workpiece during normal operation allows the creation of a thermal profile using an IR camera. In this way, the operation of the manufacturing process can be verified. For example, over time, the thermal coupling between the platen and the workpiece may change. This change may be caused by variations in clamping force between the platen and the workpiece; changes in flow rate of the back side gas that is directed toward the back side of the workpiece, or other causes. This change in thermal coupling may affect the ultimate temperature of the workpiece during implant, thereby affecting the resulting product. By introducing a calibration workpiece during normal operation, the thermal coupling can be verified with minimal impact to the operation. This calibration wafer may be introduced in the same manner as normal workpieces, and may or may not actually be processed in the processing chamber. Rather, its purpose is to allow periodic validation of the process, by allowing actual workpiece temperatures to be measured without impacting the operation of the processing chamber. In other words, it is not necessary to perform any special procedures to introduce the calibration workpiece and to determine actual workpiece temperatures.

Figure 8:
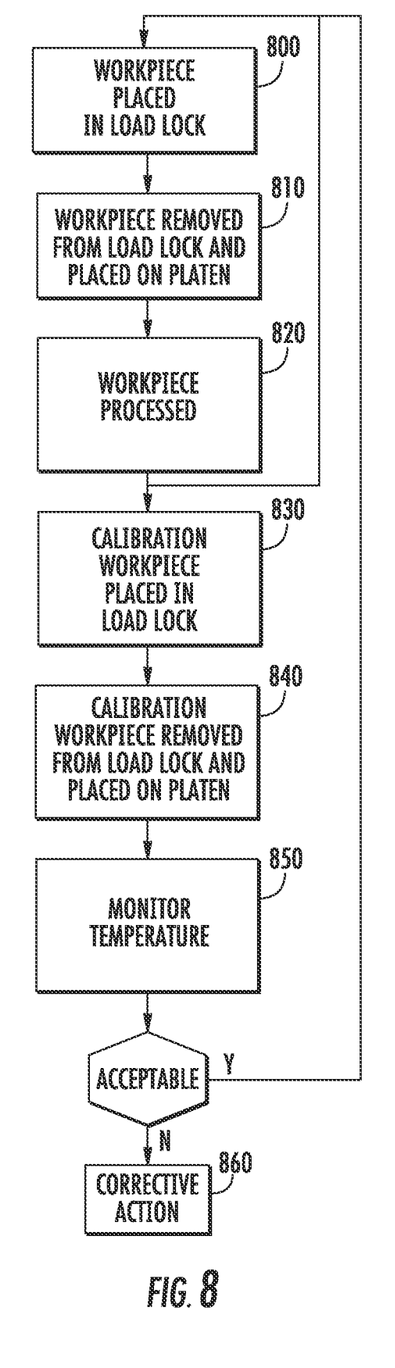
FIG. 8 shows a representative flowchart used to validate a manufacturing process.

A flowchart representing the use of a calibration workpiece during normal operation is shown in FIG. 8. First, as shown in operation 800, a workpiece is placed in the load lock. This workpiece is then removed by a robotic mechanism within the processing chamber and placed on the platen, as shown in operation 810. The platen may be heated to an elevated temperature to facilitate high temperature processing of the workpiece, such as ion implantation. The workpiece is then processed, as shown in operation 820. After processing is complete, the workpiece is removed from the platen by the robotic mechanism. The sequence of operations 800-820 may be repeated a plurality of times. At some point, a calibration workpiece 400 is placed in the load lock as shown in operation 830. This calibration workpiece 400 is removed from the load lock by the robotic mechanism and placed on the platen, in the same manner as a normal workpiece, as shown in operation 840. The calibration workpiece has a coating that has a nearly constant emissivity over a desired temperature range. In this embodiment, the desired temperature range may be a 100° range centered around the elevated temperature of the platen. After the calibration workpiece 400 has been placed on the platen, its temperature can be monitored and measured, as shown in operation 850. As explained above, this may allow validation that the thermal coupling between the platen and the workpieces is still within acceptable limits. If the temperature is unacceptable, a corrective action may be initiated, as shown in operation 860. This may include changing the temperature of the platen 100, cleaning the platen, or some other action. If the temperature has been validated, the calibration workpiece 400 is removed from the platen 100, as shown in operation 870. After this, more workpieces may be processed normally, according to the sequence in operations 800-820.

In a further embodiment, the temperature uniformity of the calibration workpiece can be obtained as well. For example, in one embodiment, the coating is applied to the entirety of the upper surface of the calibration workpiece. The IR camera 200 is then focused at a plurality of points on the upper surface to create a thermal image. In another embodiment, the coating is applied to at least one diameter of the upper surface of the calibration workpiece. The IR camera 200 is then focused at a plurality of points on the diameter. Based on this, the temperature uniformity of the calibration workpiece can be estimated. This estimate may relate temperature to distance from the center of the calibration workpiece. The use of more than one diameter may allow more complex estimations to be performed.

Figure 9:
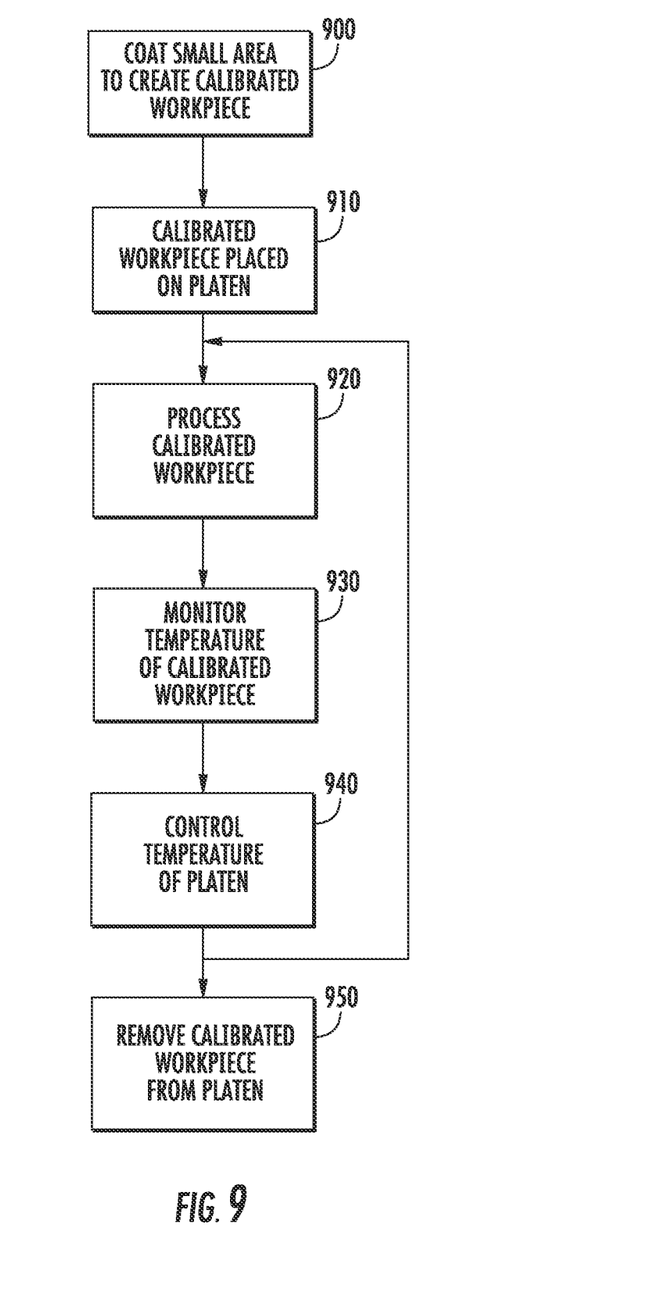
FIG. 9 shows a representative flowchart using closed loop temperature control.

In another embodiment, workpieces that have a small portion of the workpiece that is coated are processed in the processing chamber, as shown in FIG. 9. In other words, these calibrated workpieces act as both calibration workpieces and normally processed workpieces. These calibrated workpieces may be processed under temperature feedback from the IR camera. In this embodiment, a small portion of the workpiece that is not used for product may have the coating applied thereto, as shown in operation 900. This allows the processing operation to be performed in a closed loop manner, instead of the open loop calibration described above. For example, the temperature of the calibrated workpiece can be monitored while it is being processed, and immediate corrections can be made by adjusting the temperature of the platen in real time. This technique would be applicable where more stringent temperature control during workpiece processing may be desirable. Thus, after the coating is applied to a portion of the surface, the calibrated workpiece is moved to the platen, as shown in operation 910. The calibrated workpiece can then be processed, as shown in operation 920, in the same fashion as other workpieces are typically done. While the calibrated workpiece is being processed, the IR camera may be continuously monitoring the temperature of the calibrated workpiece, by focusing on the coated portion, as shown in operation 930. The monitored temperature of the coated portion is then used to control the temperature of the platen 300, as shown in operation 940. This allows tighter temperature control than may otherwise be possible. After the calibrated workpiece has been processed, it is removed from the platen, as shown in operation 950. Another calibrated workpiece can then be processed using the sequence shown in FIG. 9.

The techniques described in this application have described its use with respect to silicon workpieces. While these techniques are appropriate for silicon, they are useful for other materials that have low or variable IR emissivity in the working temperature ranges. As an example, quartz also has a large emissivity variation. The emissivity of quartz may vary for a value of nearly 0.9 at 20° C. to a value of almost 0.3 at 750° C. The calibration technique would be similarly applicable to quartz workpieces. Any other material with variable emissivity over the desired temperature range may also benefit from this technique.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A processing system, comprising:
   a platen;
   a calibration workpiece disposed on said platen;
   an IR camera using a range of wavelengths in an infrared spectrum to determine a temperature of said calibration workpiece; and
   a coating disposed on a portion of an upper surface of said calibration workpiece, said coating having a nearly constant emissivity over a range of temperatures at said range of wavelengths.

2. The processing system of claim 1, wherein said range of temperatures is between 0° C. and 600° C.

3. The processing system of claim 1, wherein said coating comprises carbon.

4. The processing system of claim 1, wherein said coating is applied along a diameter of said upper surface.

5. The processing system of claim 1, wherein said coating is applied on an entirety of said upper surface.

6. The processing system of claim 1, wherein said range of wavelengths is between 1.0 µm and 14.0 µm.

7. A method for calibrating a workpiece process, comprising:
   maintaining a heated platen in a process chamber at an elevated temperature greater than 100° C.;
   introducing a calibration workpiece to said process chamber, said calibration workpiece comprises a coating on a portion of its upper surface, said coating having a nearly constant emissivity over a desired temperature range;
   placing said calibration workpiece on said heated platen;
   monitoring a temperature of said calibration workpiece over time by focusing an IR camera at said portion; and
   recording a time for said calibration workpiece to reach a predetermined temperature.

8. The method of claim 7, further comprising processing a workpiece after said recording, wherein said processing comprises:
   placing said workpiece on said heated platen;
   waiting a predetermined amount of time; and
   processing said workpiece after said waiting, where said predetermined amount of time is determined based on said recorded time for said calibration workpiece to reach said predetermined temperature.

9. The method of claim 7, wherein said desired temperature range is a 100° C. range centered about said elevated temperature.

10. The method of claim 7, wherein said coating is applied to an entirety of said upper surface of said calibration workpiece, and further comprising determining a temperature uniformity of said calibration workpiece by focusing said IR camera at a plurality of points on said upper surface.

11. The method of claim 7, wherein said portion comprises a diameter of said upper surface, and further comprising estimating a temperature uniformity of said calibration workpiece by focusing said IR camera at a plurality of points on said diameter.

12. A method of validating a workpiece manufacturing process, comprising:
   introducing a first workpiece into a process chamber;
   disposing said first workpiece on a heated platen in said process chamber, said heated platen at an elevated temperature greater than 100° C.;
   processing said first workpiece while on said heated platen;
   introducing a calibration workpiece into said process chamber in a same manner as said first workpiece was introduced, wherein said calibration workpiece comprises a coating on a portion of its upper surface, said coating having a nearly constant emissivity over a desired temperature range;
   measuring a temperature of said calibration workpiece using an IR camera focused at said portion having said coating; and
   verifying said temperature is within an acceptable range.

13. The method of claim 12, further comprising:
   introducing a second workpiece into said process chamber after verifying said temperature is within said acceptable range;
   disposing said second workpiece on said heated platen in said process chamber; and
   processing said second workpiece while on said heated platen.

14. The method of claim 12, further comprising performing a corrective action if said temperature is not within said acceptable range.

15. The method of claim 12, wherein said introducing comprises:
   placing a workpiece in a load lock; and
   removing said workpiece from said load lock using a robotic mechanism disposed within said process chamber.

16. The method of claim 12, wherein said desired temperature range is a 100° C. range centered about said elevated temperature.

17. The method of claim 12, wherein said coating is applied to an entirety of said upper surface of said calibration workpiece, and further comprising determining a temperature uniformity of said calibration workpiece by focusing said IR camera at a plurality of points on said upper surface.

18. The method of claim 12, wherein said portion comprises a diameter of said upper surface, and further comprising estimating a temperature uniformity of said calibration workpiece by focusing said IR camera at a plurality of points on said diameter.

19. A method of processing a workpiece at an elevated temperature, comprising:
   applying a coating to a first portion of an upper surface of said workpiece, said coating having a nearly constant emissivity about a desired temperature range;
   placing said workpiece on a heated platen;
   focusing an IR camera at said first portion so as to monitor a temperature of said workpiece;
   processing a second portion of said workpiece, said second portion different from said first portion; and
   adjusting a temperature of said heated platen based on said monitored temperature of said workpiece while said workpiece is being processed so as to maintain said workpiece at said elevated temperature, wherein said elevated temperature is greater than 100° C.

20. The method of claim 19, wherein said desired temperature range is a 100° C. range centered about said elevated temperature.

* * * * *